United States Patent
Broekaert

(10) Patent No.: US 11,431,309 B2
(45) Date of Patent: Aug. 30, 2022

(54) METHOD AND STRUCTURE FOR CONTROLLING BANDWIDTH AND PEAKING OVER GAIN IN A VARIABLE GAIN AMPLIFIER (VGA)

(71) Applicant: MARVELL ASIA PTE, LTD., Singapore (SG)

(72) Inventor: Tom Peter Edward Broekaert, San Jose, CA (US)

(73) Assignee: MARVELL ASIA PTE LTD., Singapore (SG)

( * ) Notice: Subject to any disclaimer, the term of this patent is extended or adjusted under 35 U.S.C. 154(b) by 10 days.

(21) Appl. No.: 17/065,164

(22) Filed: Oct. 7, 2020

(65) Prior Publication Data
US 2021/0021246 A1   Jan. 21, 2021

Related U.S. Application Data

(63) Continuation of application No. 16/229,301, filed on Dec. 21, 2018, now Pat. No. 10,833,643.

(51) Int. Cl.
| | |
|---|---|
| H03G 3/30 | (2006.01) |
| H03F 3/45 | (2006.01) |
| H03G 1/00 | (2006.01) |
| H03G 1/02 | (2006.01) |

(52) U.S. Cl.
CPC ............. *H03G 1/0023* (2013.01); *H03G 1/02* (2013.01); *H03G 3/3036* (2013.01); *H03G 3/3068* (2013.01)

(58) Field of Classification Search
CPC .......... H03G 1/0023; H03G 3/30; H03F 3/45
See application file for complete search history.

(56) References Cited

U.S. PATENT DOCUMENTS

| | | | |
|---|---|---|---|
| 6,512,416 B2 * | 1/2003 | Burns ....................... | H03F 3/72 330/129 |
| 6,909,309 B2 * | 6/2005 | Green .............. | H03K 19/09432 326/86 |
| 6,911,865 B2 * | 6/2005 | Fanous ............... | H03F 3/45201 330/252 |
| 7,558,556 B1 * | 7/2009 | Moloudi .................. | H04B 1/40 327/267 |
| 9,531,086 B1 * | 12/2016 | Bulzacchelli ............ | H01Q 3/28 |

(Continued)

*Primary Examiner* — Patricia T Nguyen

(57) ABSTRACT

A method of controlling bandwidth and peaking over gain in a variable gain amplifier (VGA) device and structure therefor. The device includes at least three differential transistor pairs configured as a cross-coupled differential amplifier with differential input nodes, differential bias nodes, differential output nodes, a current source node, and two cross-coupling nodes. The cross-coupled differential amplifier includes a load resistor coupled to each of the differential output nodes and one of the cross-coupling nodes, and a load inductor coupled to the each of the cross-coupling nodes and a power supply rail. A current source is electrically coupled to the current source node. The cross-coupling configuration with the load resistance and inductance results in a lower bandwidth and lowered peaking at low gain compared to high gain. Further, the tap point into the inductor can be chosen as another variable to "tune" the bandwidth and peaking in a communication system.

20 Claims, 3 Drawing Sheets

(56) References Cited

U.S. PATENT DOCUMENTS

2005/0110569 A1\* 5/2005 Bhattacharjee ..... H03F 3/45183
330/254
2010/0201447 A1\* 8/2010 Hyogo ................... H03D 7/165
330/277

\* cited by examiner

METHOD AND STRUCTURE FOR CONTROLLING BANDWIDTH AND PEAKING OVER GAIN IN A VARIABLE GAIN AMPLIFIER (VGA)

CROSS-REFERENCES TO RELATED APPLICATIONS

This application is a continuation of and claims priority to U.S. patent application Ser. No. 16/229,301 filed Dec. 21, 2018, which is incorporated herein by reference in its entirety.

BACKGROUND OF THE INVENTION

The present invention relates to communication systems and integrated circuit (IC) devices. More particularly, the present invention provides for improved methods and devices for controlling bandwidth and peaking over gain in a variable gain amplifier (VGA).

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Amplifiers are commonly used as stages in communication systems to boost signals by a gain factor before outputting the signal to another stage. Typical applications of such amplifiers require control over bandwidth and peaking to maintain performance within target specifications. However, as systems include more and more stages, it becomes difficult to control the bandwidth and peaking of an amplifier stage.

Contemporary amplifiers have been inadequate for controlling bandwidth and peaking. Therefore, improved amplifier structure and methods, including improved methods of controlling bandwidth and gain, are highly desired.

BRIEF SUMMARY OF THE INVENTION

The present invention relates to communication systems and integrated circuit (IC) devices. More particularly, the present invention provides for improved methods and devices for controlling bandwidth and peaking over gain in a variable gain amplifier (VGA).

A "full" Gilbert cell, also known as a four quadrant multiplier, is a conventional cross-coupled differential amplifier often used in radio frequency (RF) integrated circuits. Common applications of such cells include mixers, automatic gain control (AGC) amplifiers, amplitude modulators, double sideband (DSB) modulators, single sideband (SSB) modulators, AM detectors, SSB and DSB detectors, frequency doublers, squaring circuits, dividers, square-root circuits, root-mean-square measuring circuits, and the like. There are also "half" Gilbert cells, also known as two quadrant multipliers. However, even conventional Gilbert cells have difficulty controlling bandwidth and peaking when integrated into a system with many other stages.

The present invention provides a modified Gilbert cell structure for improved control of bandwidth and peaking over gain in variable gain amplifier (VGA). The device receives a differential input signal having a first input signal and a second input signal; and a differential bias signal having a first bias signal and a second bias signal. In a specific example, the differential input signal can be a differential RF input signal. The differential bias signal can be a differential local oscillator (LO) signal or a static differential signal. Further, the differential bias signal controls the gain of the Gilbert cell that amplifies the differential RF input signal.

The device includes at least three differential transistor pairs. The first differential transistor pair includes transistors denoted T1 and T2. Each transistor includes a first node, a second node, and a third node; wherein the third nodes of each transistor in the pair are electrically coupled together. A first load resistor is electrically coupled to the second node of T2 and a first load node. A first load inductor is electrically coupled to the first load node and a power supply rail.

The second differential transistor pair include transistors denoted T3 and T4. Similarly, each transistor includes a first node, a second node, and a third node; wherein the third nodes of each transistor in the pair are electrically coupled together. Also, the load configuration is similar with a second load resistor electrically coupled to the second node of T3 and a second load node, as well as and a second load inductor electrically coupled to the second load node and the power supply rail.

The cross-coupling configuration is such that the second node of T4 is electrically coupled to the first load node and the second node of T1 is electrically coupled to the second load node. The second node of T2 and the second node of T3 form differential output nodes. Traditionally, the current components that run through T1 and T4 are "dumped" to the power supply rail. With the load resistors and load inductors, this configuration results in a "half" Gilbert configuration on each of the load resistors and a "full" Gilbert configuration on each of the load inductors. The result is higher bandwidth and peaking at high gain compared to low gain.

Each component of the differential input signal is fed into one transistor of each of the two differential transistor pairs in the cross-coupled configuration. The first node of T2 is electrically coupled to the first node of T3, and the first input signal is electrically coupled to the first node of T2 and the first node of T3. The first node of T1 is electrically coupled to the first node of T4, and the second input signal is electrically coupled to the first node of T1 and the first node of T4.

The third differential pair provides the input signal in differential current form for the cross-coupled differential pairs discussed previously. The third differential transistor pair includes transistors denoted T5 and T6, and, similar to the other pairs, each transistor includes a first node, a second node, and a third node. Here, the third nodes of each transistor in the pair are electrically coupled to a current source node, and a current source is electrically coupled between the current source node and ground.

As discussed above, by cross coupling the T1 and T4 current to the load inductors (i.e., "full" Gilbert configuration), the effect of the load inductors is effectively reduced at low gain. In specific example, the tap point into the inductor can be chosen as another variable to "tune" the bandwidth and peaking over gain. When incorporated into a system with many stages, this "tuning" provides another means of mitigating effects on gain and peaking.

Many benefits are recognized through various embodiments of the present invention. Such benefits include improved control of bandwidth and peaking over gain. In a specific example, the improved amplifier configuration results in higher bandwidth and peaking at high gain. The effects of this configuration can be used to mitigate the effects of other stages in a communication system on bandwidth and peaking. Other benefits will be recognized by those of ordinary skill in the art that the mechanisms described can be applied to other communications systems as well.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which.

DETAILED DESCRIPTION OF THE INVENTION

Figure 1:
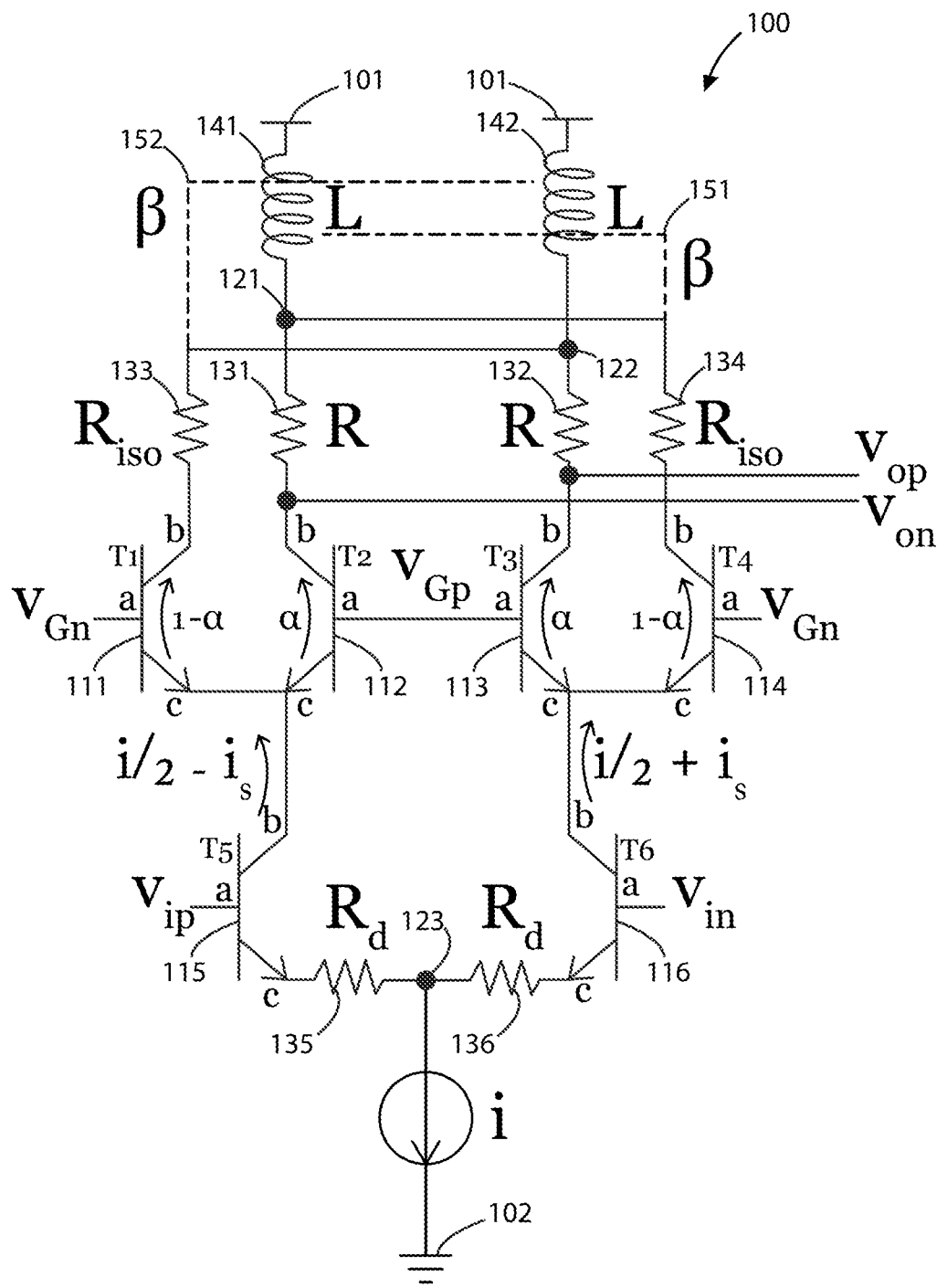
FIG. 1 is a simplified circuit diagram of a variable gain amplifier (VGA) device according to an example of the present invention.

The present invention relates to communication systems and integrated circuit (IC) devices. More particularly, the present invention provides for improved methods and devices for controlling bandwidth and peaking over gain in a variable gain amplifier (VGA).

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

A "full" Gilbert cell, also known as a four quadrant multiplier, is a conventional cross-coupled differential amplifier often used in radio frequency (RF) integrated circuits. Common applications of such cells include mixers, automatic gain control (AGC) amplifiers, amplitude modulators, double sideband (DSB) modulators, single sideband (SSB) modulators, AM detectors, SSB and DSB detectors, frequency doublers, squaring circuits, dividers, square-root circuits, root-mean-square measuring circuits, and the like. There are also "half" Gilbert cells, which are also known as two quadrant multipliers. However, even conventional Gilbert cells have difficulty controlling bandwidth and peaking when integrated into a system with many other stages.

The present invention provides a modified Gilbert cell structure for improved control of bandwidth and peaking over gain in variable gain amplifier (VGA). Further details are provided below of the device and its components are provided below.

FIG. 1 is a simplified diagram of a variable gain amplifier (VGA) device according to an embodiment of the present invention. Device 100 receives a differential input signal having a first input signal (denoted $v_{ip}$) and a second input signal (denoted yin); and a differential bias signal having a first bias signal (denoted $v_{Gp}$) and a second bias signal (denoted $v_{Gn}$). In a specific example, the differential input signal can be a differential RF input signal. The differential bias signal can be a differential local oscillator (LO) signal or a static differential signal. Further, the differential bias signal controls the gain of the Gilbert cell that amplifies the differential RF input signal.

As shown, device 100 includes at least three differential transistor pairs. The first differential transistor pair includes transistors denoted T1 (111) and T2 (112). Each transistor includes a first node (111-$a$, 112-$a$), a second node (111-$b$, 112-$b$), and a third node (111-$c$, 112-$c$); wherein the third nodes (111-$c$, 112-$c$) of each transistor in the pair are electrically coupled together. A first load resistor 131 (denoted R) is electrically coupled to the second node of T2 (112-$b$) and a first load node 121. A first load inductor 141 (denoted L) is electrically coupled to the first load node 131 and a power supply rail 101.

The second differential transistor pair includes transistors denoted T3 (113) and T4 (114). Similarly, each transistor includes a first node (113-$a$, 114-$a$), a second node (113-$b$, 114-$b$), and a third node (113-$c$, 114-$c$); wherein the third nodes (113-$c$, 114-$c$) of each transistor in the pair are electrically coupled together. Also, the load configuration is similar with a second load resistor 132 (also denoted R) electrically coupled to the second node of T3 (113-$b$) and a second load node 122, as well as and a second load inductor 142 (also denoted L) electrically coupled to the second load node 122 and the power supply rail 101. In a specific example, the device 100 can further include a first isolation resistor 133 (denoted $R_{iso}$) electrically coupled between the second node of T1 (111-b) and the second load node 122, and a second isolation resistor 134 (also denoted $R_{iso}$) electrically coupled between the second node of T4 (114-b) and the first load node 121.

The cross-coupling configuration is such that the second node of T4 (114-b) is electrically coupled to the first load node 121 and the second node of T1 (111-b) is electrically coupled to the second load node 122. The second node of T2 (112-b) and the second node of T3 (113-b) form differential output nodes denoted $v_{op}$ and $v_{on}$. Traditionally, the current components that run through T1 and T4 are "dumped" to the power supply rail 101. With the load resistors (131, 132) and load inductors (141, 142), this configuration results in a "half" Gilbert configuration on each of the load resistors (131, 132) and a "full" Gilbert configuration on each of the load inductors (141, 142). The result is higher bandwidth and peaking at high gain compared to low gain.

Each component of the differential bias signal is fed into one transistor (T2, T3) of each of the two differential transistor pairs in the cross-coupled configuration. The first node of T2 (112-a) is electrically coupled to the first node of T3 (113-a), and the first bias signal $v_{Gp}$ is electrically coupled to the first node of T2 (112-a) and the first node of T3 (113-a). The first node of T1 (111-a) is electrically coupled to the first node of T4 (114-a), and the second bias signal $v_{Gn}$ is electrically coupled to the first node of T1 (111-a) and the first node of T4 (114-a).

The third differential pair provides the input signal in differential current form for the cross-coupled differential pairs discussed previously. The third differential transistor pair includes transistors denoted T5 (115) and T6 (116), and, similar to the other pairs, each transistor includes a first node (115-a, 116-a), a second node (115-b, 116-b), and a third node (115-c, 116-c). Here, the third nodes (115-c, 116-c) of each transistor in the pair are electrically coupled to a current source node 123, and a current source 150 (denoted i) is electrically coupled between the current source node 123 and ground 102. Also, the first input signal $v_{ip}$ is electrically coupled to the first node of T5 115-a, and the second input signal yin is electrically coupled to the first node of T6 116-a. In a specific example, a first degeneration resistor 135 (denoted $R_d$) can be electrically coupled between the third node of T5 (115-c) and the current source node 123, and a second degeneration resistor 136 (also denoted $R_d$) can be electrically coupled between the third node of T6 (116-c) and the current source node 123. These degeneration resistors are used to linearize the gain of the VGA, and can be configured as emitter degeneration resistors, source degeneration resistors, or the like.

By cross coupling the T1 and T4 current to the load inductors (i.e., "full" Gilbert configuration), the effect of the load inductors is effectively reduced at low gain. The output voltage on the R load 132, i.e., $v_{op}$, is determined by $R\alpha i_s$, where R is the value of the resistor R, $\alpha$ is the current steering factor of the Gilbert (which is set by $v_{Gp}-v_{Gn}$; here it is $\alpha-(1-\alpha)=2\alpha-1$), and $i_s$ is the current from current source 150. Further, R+sL represents the cross-coupled load configuration in the present invention. Thus, the $\alpha$ term is controlling the gain of the VGA, which is shown as the current components that run through T2 and T3. As stated above, the current components that run through T1 and T4 (both denoted 1-$\alpha$) just run to the power supply rail 102 in conventional examples. In the present configuration, $v_{op}=[R\alpha+sL(2\alpha-1)]i_s$.

In an example of the present invention, the tap point into the inductor can be chosen as another variable $\beta$, where $0<\beta<1$, which changes the load inductance to further "tune" the bandwidth and peaking over gain (a). According to an example of the present invention, $L_{eff}=[\alpha(1+\beta)-\beta]L$. When $\beta=1 \rightarrow L_{eff}=(2\alpha-1)L$. When $\beta=0 \rightarrow L_{eff}=\alpha L$. The tap points 151 and 152 are shown by the dotted lines denoted $\beta$ in FIG. 1. When incorporated into a system with many stages, this "tuning" provides another means (using both L and $\beta$) of mitigating effects on gain and peaking.

In a specific example, each of the transistors is a bipolar junction transistor (BJT), with the first node being a base node, the second node being a collector node, and the third node being an emitter node. In another example, each of the transistors is a field effect transistor (FET), with the first node being a gate node, the second node being a drain node, and the third node being a source node. Those of ordinary skill in the art will recognize other variations, modifications, and alternatives.

Figure 2:
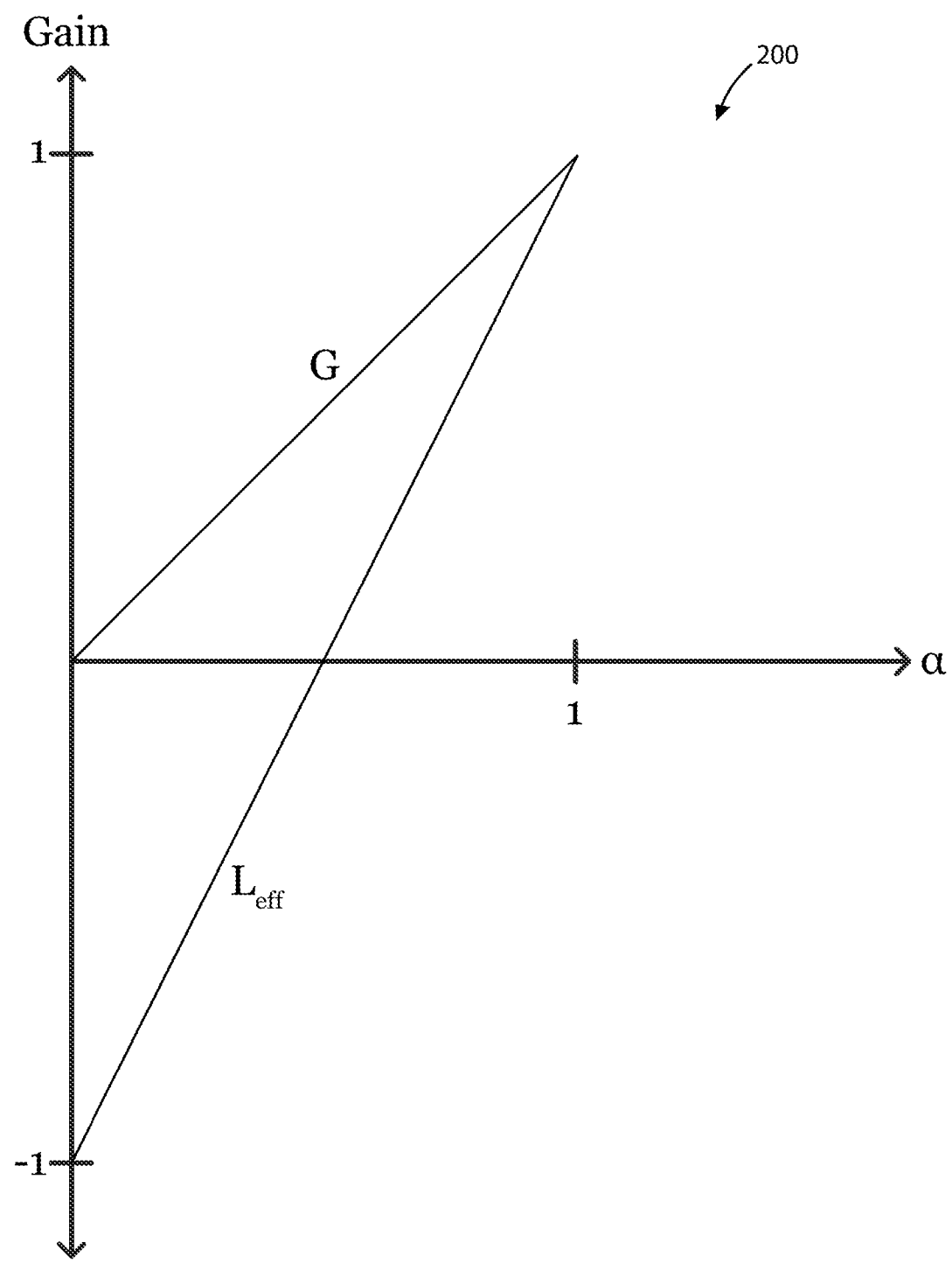
FIG. 2 is a simplified graph of gain (A) and effective load inductance over current steering factor (α) illustrating the characteristics of a VGA device according to an example of the present invention.

FIG. 2 is a simplified graph of gain (A) over current steering factor ($\alpha$) illustrating the characteristics of a VGA device according to the an example of the present invention. As discussed above, $v_{op}=[R\alpha+sL(2\alpha-1)]i_s$ in the present configuration of the resistive and inductive loads. Graph 200 shows the effect of gain G on $\alpha$ and the effective inductance of L ($L_{eff}$). For example, at half gain (A=0.5), $\alpha$=0.5 and $L_{eff}$=0. This illustrates why with the R+sL load results in a higher bandwidth at high gain as opposed to low gain.

Figure 3:
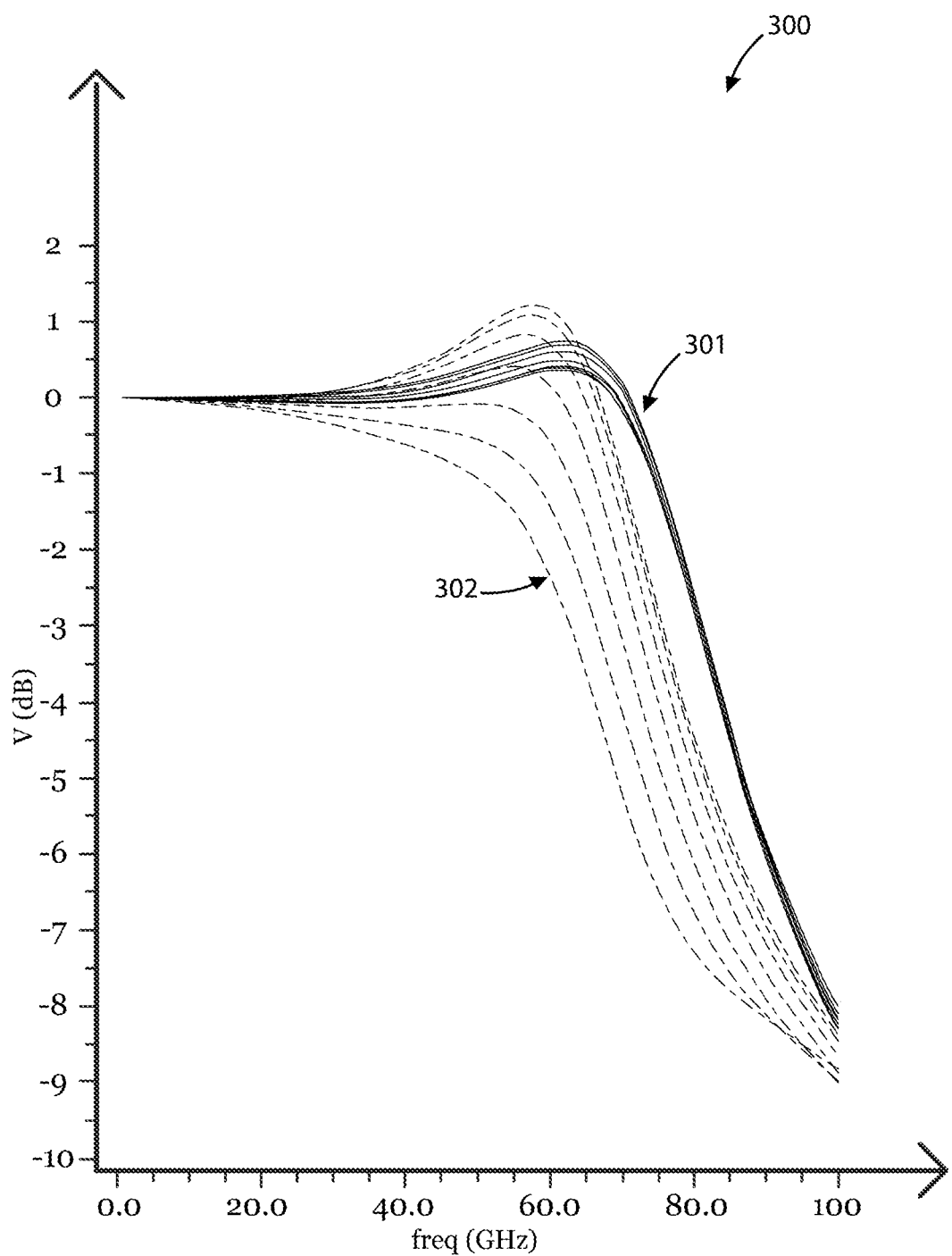
FIG. 3 is a simplified graph illustrating a simulation of a VGA with gain dependent inductive peaking according to an example of the present invention.

FIG. 3 is a simplified graph illustrating a simulation of a VGA with gain dependent inductive peaking according to an example of the present invention. More specifically, graph 300 shows normalized amplifier outputs at different gain levels for a conventional ideal amplifier 301 (solid lines) and for an amplifier with gain dependent inductive peaking 302 (dotted lines) according to an example of the present invention. As shown, the present amplifier with gain dependent inductive peaking exhibits greater changes in peaking over gain compared to the conventional amplifier with fixed inductive peaking. The lowered peaking at low gain becomes useful for mitigating peaking effects from having multiple stages in a communication system. For example, this effect can be particularly useful in a transimpedance amplifier (TIA) datapath. Of course, there can be other variations, modifications, and alternatives.

In an example, the present invention provides a method of controlling bandwidth and peaking over gain in a variable gain amplifier (VGA) device. The method includes providing a cross-coupled differential amplifier configured as a Gilbert cell having differential input nodes, differential bias nodes, differential output nodes, a current source node, and two cross-coupling nodes. The cross-coupled differential amplifier includes a load resistor coupled to each of the differential output nodes and one of the cross-coupling nodes, and the cross-coupled differential amplifier includes a load inductor coupled to the each of the cross-coupling nodes and a power supply rail.

In the operation of the VGA, the method includes providing a current source electrically coupled to the current source node, providing a differential bias signal to the differential bias nodes, and providing a differential input signal to the differential input nodes. These steps result in the VGA amplifying, by the cross-coupled differential amplifier, the differential input signal at the differential output nodes, wherein the output of the cross-coupled differential amplifier is characterized by increased bandwidth and reduced peaking at low gain. In a specific example, the first load inductor includes a first tunable tap point and wherein the second load inductor includes a second tunable tap point. Then, the method further includes tuning, by the first and second tunable tap points, the load inductors to mitigate effects on bandwidth and peaking.

Many benefits are recognized through various embodiments of the present invention. Such benefits include improved control of bandwidth and peaking over gain. In a specific example, the improved amplifier configuration results in higher bandwidth and lowered peaking at low gain. The effects of this configuration can be used to mitigate the effects of other stages in a communication system on bandwidth and peaking. Other benefits will be recognized by those of ordinary skill in the art that the mechanisms described can be applied to other communications systems as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable gain amplifier (VGA) device comprising:
   a first differential transistor pair having a first differential input, a first coupled node, and a first differential output;
   a second differential transistor pair having a second differential input, a second coupled node, and a second differential output; and
   a third differential transistor pair having a third differential input, a third coupled node, and a third differential output; the third differential input being configured as a VGA differential input receiving a differential input signal, the third coupled node being coupled to a grounded current source
   wherein first outputs of the first and second differential outputs are coupled to a power supply rail through respective load resistors and load inductors; and
   wherein the load inductors include tunable tap points to tune at least one of bandwidth and peaking.

2. The device of claim 1 wherein each of the differential transistor pairs is a pair of bipolar junction transistors (BJTs).

3. The device of claim 1 wherein each of the differential transistor pairs is a pair of field effect transistors (FETs).

4. The device of claim 1 wherein the load resistors comprise a first load resistor and a second load resistor, wherein the load inductors comprise a first load inductor and a second load inductor, and wherein the first output of the first differential output is coupled to the first load resistor, the first load resistor being coupled to the first load inductor, and the first load inductor being coupled to the power supply rail; and the first output of the second differential output is coupled to the second load resistor, the second load resistor being coupled to the second load inductor, the second load inductor being coupled to the power supply rail; and
   wherein a second output of the first differential output is coupled to a node between the second load resistor and the second load inductor, and wherein a second output of the second differential output is coupled to a node between the first load resistor and the first load inductor;
   the device further comprising a first isolation resistor coupled between the second output of the first differential output and the node between the second load resistor and the second load inductor; and a second isolation resistor coupled between the second output of the second differential output and the node between the first load resistor and the first load inductor.

5. The device of claim 4 wherein the tunable tap points comprise a first tunable tap point and a second tunable tap point; wherein the first load inductor includes the first tunable tap point; wherein the second load inductor includes the second tunable tap point; and wherein the first and second tunable tap points are configured to reduce the peaking at low gain.

6. The device of claim 1 wherein the differential input signal is a differential radio frequency (RF) input signal;
   wherein a first input of the first differential input and a first input of the second differential input are configured to receive a first bias signal of a VGA differential bias signal;
   wherein a second input of the first differential input and a second input of the second differential input are configured to receive a second bias signal of the VGA differential bias signal; and
   wherein the VGA differential bias signal is a differential local oscillator (LO) signal or a static differential gain control signal.

7. The device of claim 1 further comprising a first degeneration resistor and a second degeneration resistor configured symmetrically within the third differential transistor pair around the third coupled node; and wherein a first output of the third differential output is coupled to the first coupled node and a second output of the third differential output is coupled to the second coupled node.

8. The device of claim 1 wherein a first output of the first differential output and a first output of the second differential output are configured as a VGA differential output; and wherein the VGA differential output is characterized by the following: $v_o = [R\alpha + sL(2\alpha-1)]i_s$, where $v_o$ is an output voltage on the first or second load resistor, R is a value of the first or second load resistor, $\alpha$ is a current steering factor, L is a value of the first or second load inductor, $i_s$ is a signal current generated from an input signal $Y_{ip} - V_{in}$, and $R + sL$ represents a load configuration.

9. A variable gain amplifier (VGA) device comprising:
   a cross-coupled differential amplifier configured as a Gilbert cell having first and second transistors, differential input nodes, differential bias nodes, differential output nodes, a current source node, and two cross-coupling nodes; wherein the cross-coupled differential amplifier receives a differential input signal at the differential input nodes, and the first and second transistors receives a differential bias signal at the differential bias nodes;
   wherein the cross-coupled differential amplifier includes first and second load resistors each coupled to each of the differential output nodes and one of the cross-coupling nodes;
   wherein the cross-coupled differential amplifier includes first and second load inductors each coupled to the each of the cross-coupling nodes and a power supply rail; and
   a current source electrically coupled to the current source node;
   wherein the first load inductor includes a first tunable tap point and wherein the second load inductor includes a second tunable tap point; and
   wherein the first and second tunable tap points are configured to reduce peaking at low gain.

10. The device of claim 9 wherein each of the first and second transistors is a bipolar junction transistor (BJT), and wherein each of the differential bias nodes is a base node.

11. The device of claim 9 wherein each of the first and second transistors is a field effect transistor (FET), and wherein each of the differential bias nodes is a gate node.

12. A variable gain amplifier (VGA) device comprising:
a cross-coupled differential amplifier configured as a Gilbert cell having first and second transistors, differential input nodes, differential bias nodes, differential output nodes, a current source node, and two cross-coupling nodes; wherein the cross-coupled differential amplifier receives a differential input signal at the differential input nodes, and the first and second transistors receives a differential bias signal at the differential bias nodes;
wherein the cross-coupled differential amplifier includes first and second load resistors each coupled to each of the differential output nodes and one of the cross-coupling nodes;
wherein the cross-coupled differential amplifier includes first and second load inductors each coupled to the each of the cross-coupling nodes and a power supply rail; and
a current source electrically coupled to the current source node;
the device further comprising:
a first isolation resistor electrically coupled between the first transistor and a first one of the cross-coupling nodes; and
a second isolation resistor electrically coupled between the second transistor and a second one of the cross-coupling nodes.

13. The device of claim 9 further comprising:
third and fourth transistors receiving the different input signal at the differential input nodes;
a first degeneration resistor electrically coupled between the third transistor and the current source node; and
a second degeneration resistor electrically coupled between the fourth transistor and the current source node.

14. The device of claim 9 wherein the differential input signal is a differential radio frequency (RF) input signal; and wherein the differential bias signal is a differential local oscillator (LO) signal or a static differential gain control signal.

15. The device of claim 9 wherein the differential output nodes are characterized by the following: $v_o = [R\alpha + sL(2\alpha - 1)]i_s$, where $v_o$ is an output voltage on the first or second load resistor, R is a value of the first or second load resistor, $\alpha$ is a current steering factor, L is a value of the first or second load inductor, $i_s$ is a current from the current source, and R+sL represents a load configuration.

16. The device of claim 1 wherein a second output of the first differential output is coupled to a node between the second load resistor and the second load inductor, and wherein a second output of the second differential output is coupled to a node between the first load resistor and the first load inductor;
the device further comprising a first isolation resistor coupled between the second output of the first differential output and the node between the second load resistor and the second load inductor; and a second isolation resistor coupled between the second output of the second differential output and the node between the first load resistor and the first load inductor.

17. The device of claim 9 further comprising:
a first isolation resistor electrically coupled between the first transistor and a first one of the two cross-coupling nodes; and
a second isolation resistor electrically coupled between the second transistor and a second one of the two cross-coupling nodes.

18. The device of claim 12 further comprising:
third and fourth transistors receiving the different input signal at the differential input nodes;
a first degeneration resistor electrically coupled between the third transistor and the current source node; and
a second degeneration resistor electrically coupled between the fourth transistor and the current source node.

19. The device of claim 12 wherein:
the first load inductor includes a first tunable tap point and wherein the second load inductor includes a second tunable tap point; and
the first and second tunable tap points are configured to reduce peaking at low gain.

20. The device of claim 12 wherein the differential output nodes are characterized by the following: $v_o = [R\alpha + sL(2\alpha - 1)]i_s$, where $v_o$ is an output voltage on the first or second load resistor, R is a value of the first or second load resistor, $\alpha$ is a current steering factor, L is a value of the first or second load inductor, $i_s$ is a current from the current source, and R+sL represents a load configuration.

* * * * *